(12) United States Patent
Niimi et al.

(10) Patent No.: US 7,670,913 B2
(45) Date of Patent: Mar. 2, 2010

(54) METHOD FOR FORMING ULTRA-THIN LOW LEAKAGE MULTIPLE GATE DEVICES USING A MASKING LAYER OVER THE SEMICONDUCTOR SUBSTRATE

(75) Inventors: Hiroaki Niimi, Dallas, TX (US); Reima Tapani Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 357 days.

(21) Appl. No.: 11/384,753

(22) Filed: Mar. 20, 2006

(65) Prior Publication Data

US 2007/0218636 A1 Sep. 20, 2007

(51) Int. Cl.
*H01L 21/336* (2006.01)

(52) U.S. Cl. .......... 438/287; 257/250; 257/E21.01; 257/E21.179

(58) Field of Classification Search .......... 438/216, 438/142, 197, 176, 195, 275, 283, 287, 250; 257/250, 231, 406, E21.01, E21.179, E21.244
See application file for complete search history.

(56) References Cited

U.S. PATENT DOCUMENTS 5,703,391 A * 12/1997 Arima .......... 257/382
6,756,635 B2 * 6/2004 Yasuda et al. .......... 257/325
7,183,596 B2 * 2/2007 Wu et al. .......... 257/213
7,211,497 B2 * 5/2007 Hiraiwa et ........ 438/424
2002/0185693 A1 * 12/2002 Yasuda et al. .......... 257/392

* cited by examiner

*Primary Examiner*—W. David Coleman
*Assistant Examiner*—Su C Kim
(74) *Attorney, Agent, or Firm*—Warren L. Franz; Wade J. Brady, III; Frederick J. Telecky, Jr.

(57) ABSTRACT

The present invention provides a method for manufacturing a semiconductor device having multiple gate dielectric thickness layers. The method, in one embodiment, includes forming a masking layer over a semiconductor substrate in a first active region and a second active region of a semiconductor device, patterning the masking layer to expose the semiconductor substrate in the first active region, and subjecting exposed portions of the semiconductor substrate to a nitrogen containing plasma, thereby forming a first layer of gate dielectric material over the semiconductor substrate in the first active region. The method, in that embodiment, may further include incorporating oxygen into the first layer of gate dielectric material located in the first active region, and then removing the patterned masking layer, and forming a second layer of gate dielectric material over the first layer of gate dielectric material in the first active region and over the semiconductor substrate in the second active region, thereby resulting in a first greater thickness gate dielectric in the first active region and a second lesser thickness gate dielectric in the second active region.

32 Claims, 8 Drawing Sheets

METHOD FOR FORMING ULTRA-THIN LOW LEAKAGE MULTIPLE GATE DEVICES USING A MASKING LAYER OVER THE SEMICONDUCTOR SUBSTRATE

TECHNICAL FIELD OF THE INVENTION

The present invention is directed, in general, to a method for manufacturing a semiconductor device and, more specifically, to a method for manufacturing a semiconductor device having multiple gate dielectric thickness layers.

BACKGROUND OF THE INVENTION

In certain semiconductor applications it has become necessary to integrate multiple gate oxide (MGO) thicknesses for associated transistor devices onto a single integrated circuit device. One motivation for performing multiple gate oxide processing is that high performance transistors typically operate at lower voltages (e.g., 0.8 volts to 1.5 volts), and thus require thinner gate dielectric regions, whereas devices that interface with most conventional external peripherals typically require higher operating voltages (e.g., 1.8 volts to 3.5 volts), and thus require thicker gate dielectric regions. When interfacing lower voltage high performance metal oxide semiconductor field-effect transistors (MOSFETs) within a core of an integrated circuit to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating multiple different types of technology onto a single integrated circuit, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both high performance lower voltage devices within the core of the device and higher voltage I/O devices to interface with external peripheral devices.

As stated above, a multiple gate thickness structure includes thin gate dielectrics for high performance low voltage operation core devices, and thick gate dielectrics for low leakage high voltage operation I/O devices. As devices shrink, even the thick gate dielectrics are getting thinner to meet device requirements. This can cause increased leakage current for the devices, especially the high voltage devices having the thick gate dielectrics.

It has generally been accepted that the leakage current can be mitigated by introducing nitrogen atoms into the gate dielectrics to suppress leakage currents for both the thin and thick gates. One method of nitrogen atom introduction includes performing non-thermal nitridation (e.g., plasma nitridation) on the gate dielectrics. Unfortunately, this and other methods of introducing the nitrogen atoms into the gate dielectrics tend to provide a non-uniform nitrogen profile in the gate dielectric, which results in reduced reliability. The non-uniformity, and thus reduced reliability, is particularly significant in thicker gate dielectrics, such as those used in the aforementioned high voltage devices.

Accordingly, what is needed in the art is an improved method for manufacturing multiple gate thickness structures.

SUMMARY OF THE INVENTION

To address the above-discussed deficiencies of the prior art, the present invention provides a method for manufacturing a semiconductor device having multiple gate dielectric thickness layers. The method, in one embodiment, includes forming a masking layer over a semiconductor substrate in a left active region and a right active region of a semiconductor device, patterning the masking layer to expose the semiconductor substrate in the left active region, and subjecting exposed portions of the semiconductor substrate to a nitrogen containing plasma, thereby forming a first layer of gate dielectric material over the semiconductor substrate in the left active region. The method, in that embodiment, may further include incorporating oxygen into the first layer of gate dielectric material located in the left active region, and then removing the patterned masking layer, and forming a second layer of gate dielectric material over the first layer of gate dielectric material in the left active region and over the semiconductor substrate in the right active region, thereby resulting in a first greater thickness gate dielectric in the left active region and a second lesser thickness gate dielectric in the right active region.

BRIEF DESCRIPTION OF THE DRAWINGS

For a more complete understanding of the present invention, reference is now made to the following descriptions taken in conjunction with the accompanying drawings, in which.

DETAILED DESCRIPTION

Turning now to FIGS. 1-14, illustrated are sectional views illustrating how one might, in an advantageous embodiment, manufacture a semiconductor device in accordance with the principles of the present invention. While FIGS. 1-14 are specifically directed to the manufacture of a semiconductor device having triple gate dielectric thickness layers, FIGS. 1-14 also illustrate, in one sense, how one skilled in the art might manufacture a semiconductor device having at least two dielectric thickness layers, in accordance with the principles of the present invention. Thus, a method for manufacturing a semiconductor device having at least two gate dielectric thickness layers is discussed within the confines of discussing how one skilled in the art might manufacture a semiconductor device with respect to FIGS. 1-14. Nevertheless, while each of these ideas is discussed and illustrated using a single set of FIGUREs, neither should be limiting on the other.

Figure 1:
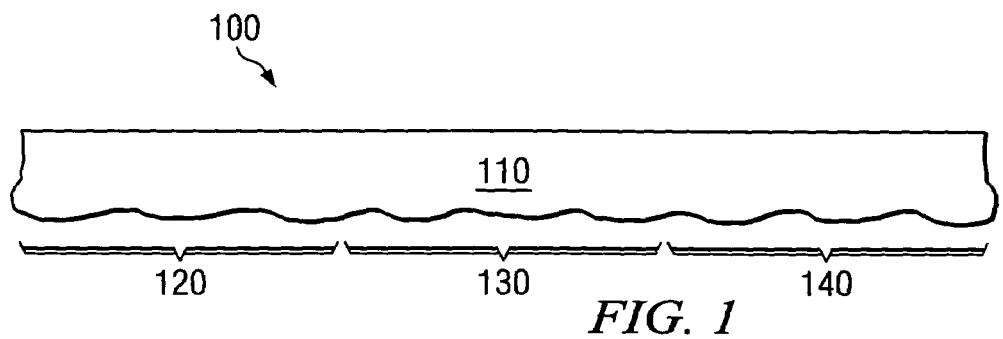
FIGS. 1-14 illustrate sectional views showing how one might, in one embodiment, manufacture a semiconductor device in accordance with the principles of the present invention.

FIG. 1 illustrates a sectional view of a partially completed semiconductor device 100 manufactured in accordance with the principles of the present invention. The semiconductor device 100 of FIG. 1 includes a semiconductor substrate 110. The semiconductor substrate 110 may, in an embodiment, be any layer located in the semiconductor device 100, including a wafer itself or a layer located above the wafer (e.g., epitaxial layer). In the embodiment illustrated in FIG. 1, the semiconductor substrate 110 is a P-type substrate; however, one skilled in the art understands that the semiconductor substrate 110 could be an N-type substrate without departing from the scope of the present invention.

The embodiment of the semiconductor device 100 illustrated in FIG. 1 includes three different regions, including a left active region 120, a center active region 130 and a right active region 140. As will be understood more fully in subsequent paragraphs, the left active region 120 is a higher voltage active region, the center active region 130 is a first lower voltage active region and the right active region 140 is a second lower voltage active region in the embodiment of FIGS. 1-14. For instance, the left active region 120 might be an input/output active region, the center active region 130 might be a first core region designed for a first performance and voltage requirement, and the right active region 140 might be a second core region designed for a second different performance and voltage requirement. Other configurations might also exist, for instance one wherein the semiconductor device 100 only includes two different regions, such as was discussed in the paragraphs above.

Figure 2:
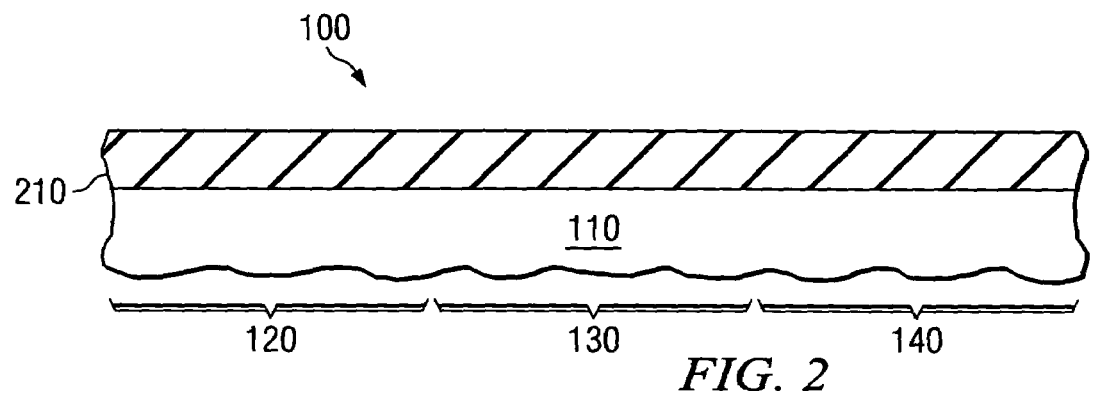

Turning now briefly to FIG. 2, illustrated is a sectional view of the semiconductor device 100 illustrated in FIG. 1 after forming a masking layer 210 over one or more of the left, center, or right active regions 120, 130, 140. In the embodiment shown, the masking layer 210 is formed over, and in this embodiment on, all of the left, center, and right active regions 120, 130, 140. The masking layer 210 may comprise many different materials and may be formed using many different processes and remain within the purview of the present invention. Nevertheless, the masking layer 210 in the embodiment of FIG. 2 comprises a silicon dioxide masking layer. For instance, the silicon dioxide masking layer could be a thermal or plasma oxidation of the semiconductor substrate 110, or alternatively a thermal or plasma oxide formed via chemical vapor deposition (CVD) or physical vapor deposition (PVD). Generally, the silicon dioxide masking layer would have a thickness ranging from about 5 nm to about 10 nm, among others. Those skilled in the art understand the processing steps that might be taken to form such a masking layer 210, thus no further detail is warranted.

Figure 3:
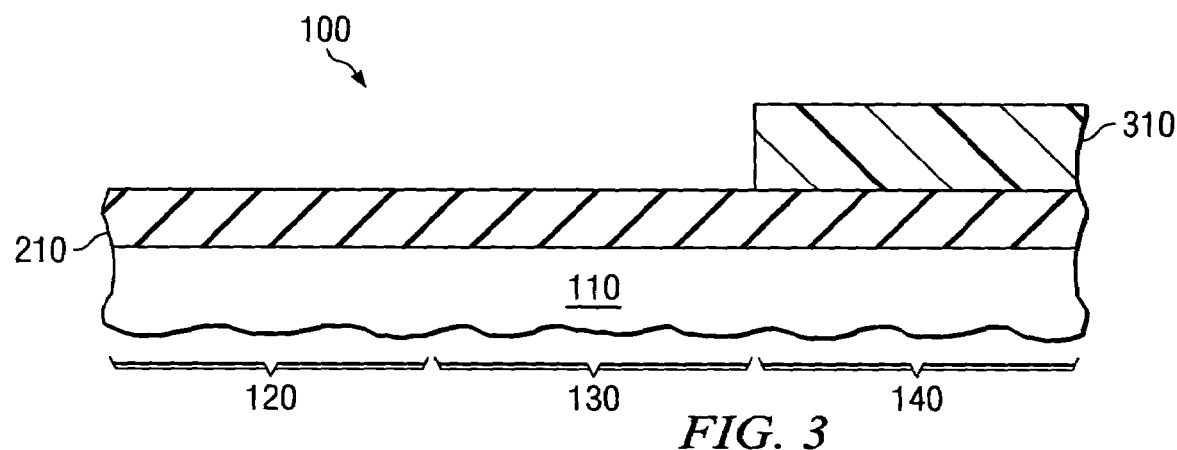

Turning now to FIG. 3, illustrated is a sectional view of the semiconductor device 100 of FIG. 2 after forming a photoresist portion 310 over the masking layer 210. In the given embodiment of FIG. 3, the photoresist portion 310 may be conventionally spun on, exposed and developed, resulting in the photoresist portion 310 remaining in the right active region 140. In other embodiments of the present invention, some of which will be discussed more fully below, the photoresist portion 310 might remain in other active regions. Those skilled in the art understand the processing steps that might be taken to form and pattern the photoresist portion 310, thus again no further detail is warranted.

Figure 4:
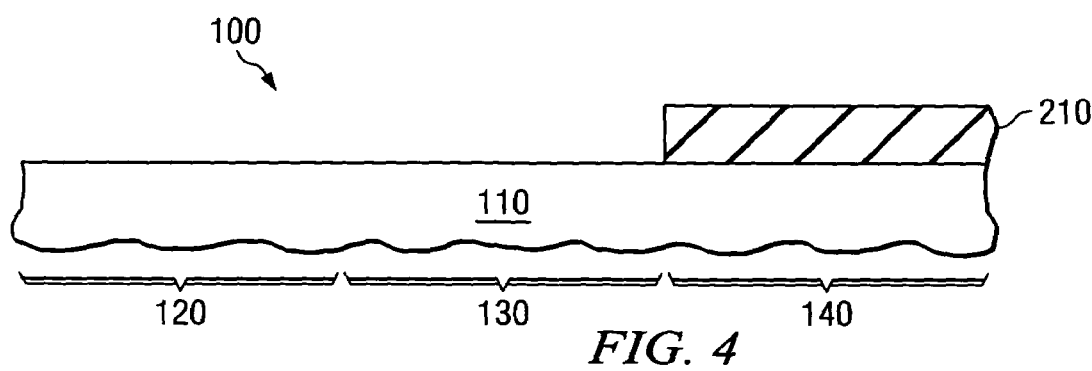

Turning now to FIG. 4, illustrated is a sectional view of the semiconductor device 100 of FIG. 3 after patterning the masking layer 210 using the photoresist portion 310 and an etchant. In the embodiment of FIG. 4, the masking layer 210 is patterned to expose the semiconductor substrate 110 in the left active region 120 and center active region 130, and protect the substrate 110 in the right active region 140. Those skilled in the art understand the process for patterning the masking layer 210, including subjected the exposed portions of the masking layer 210 to a hydrofluoric acid etch, among others. The etch used to remove the masking layer 210 should, however, be designed to be selective to the masking layer 210 and not other material layers, particularly other nitride material layers.

Figure 5:
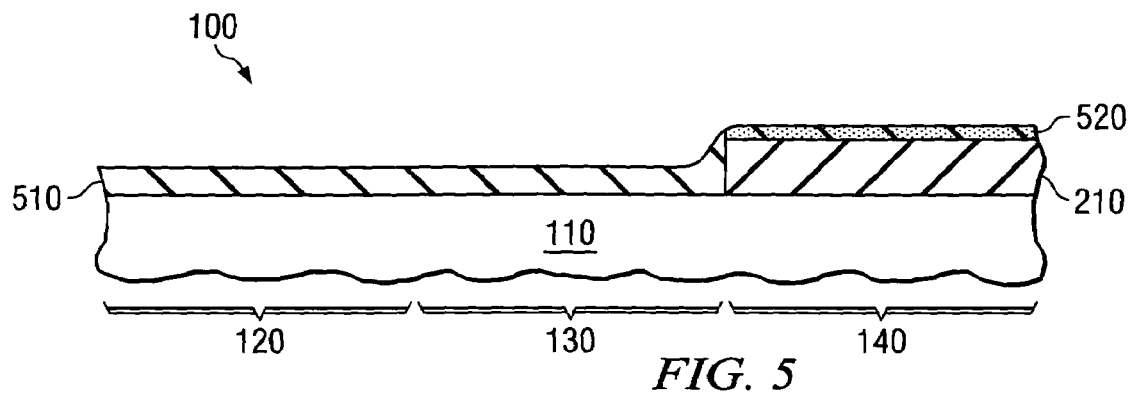

Turning now to FIG. 5, illustrated is a sectional view of the semiconductor device 100 of FIG. 4 after subjecting exposed portions of the semiconductor substrate 110 to a nitrogen containing plasma. In one embodiment of the present invention, the semiconductor substrate 110 is subjected to an initial pre-clean process (e.g., a standard wet chemical clean-up process), and then the semiconductor substrate 110 is subjected to the nitrogen containing plasma. However, this embodiment is optional. As is illustrated in the embodiment of FIG. 5, the nitrogen containing plasma forms a first layer of gate dielectric material 510 over the substrate 110 in the left and center active regions 120, 130. In this embodiment, the nitrogen containing plasma additionally forms a layer of nitrogen atoms 520 in or on an upper surface of the masking layer 210 in the right active region 140. The first layer of gate dielectric material 510 located over the left and center active regions 120, 130, at this stage of manufacture, would typically comprise $Si_xN_y$, and might have a thickness ranging from about 1 nm to about 3 nm, among others. A thickness of the layer of nitrogen atoms 520 formed in or on the masking layer 210 would typically be less than the thickness of the first layer of gate dielectric material 510 formed over the semiconductor substrate 110. For instance, the thickness of the layer of nitrogen atoms 520 formed in or on the masking layer 210 would typically range from about 0.4 nm to about 0.8 nm.

The first layer of gate dielectric material 510 and the layer of nitrogen atoms 520 may be formed using various different processes. For example, the first layer of gate dielectric material 510 and layer of nitrogen atoms 520 may be formed by subjecting the substrate 110 in the left and center active regions 120, 130, as well as the masking layer 210 in the right active region 140, respectively, to a radical nitridation process. The radical nitridation process, among others, might use a temperature ranging from about 400° C. to about 800° C., a pressure ranging from about 700 mTorr to about 900 mTorr, a microwave power ranging from about 500 Watts to about 2000 Watts, in the presence of a flow of nitrogen ranging from about 50 sccm to about 100 sccm, and a flow of argon ranging from about 950 sccm to about 1000 sccm, for a time period ranging from about 10 seconds to about 30 seconds. In an alternative embodiment, the radical nitridation process might use a temperature ranging from about room temperature to about 300° C., a pressure ranging from about 10 mTorr to about 50 mTorr, an effective pulse RF power ranging from about 300 Watts to about 700 Watts, in the presence of a flow of nitrogen ranging from about 100 sccm to about 500 sccm, for a time period ranging from about 10 seconds to about 30 seconds. These processing conditions should not be used to limit the scope of the present invention.

Figure 6:
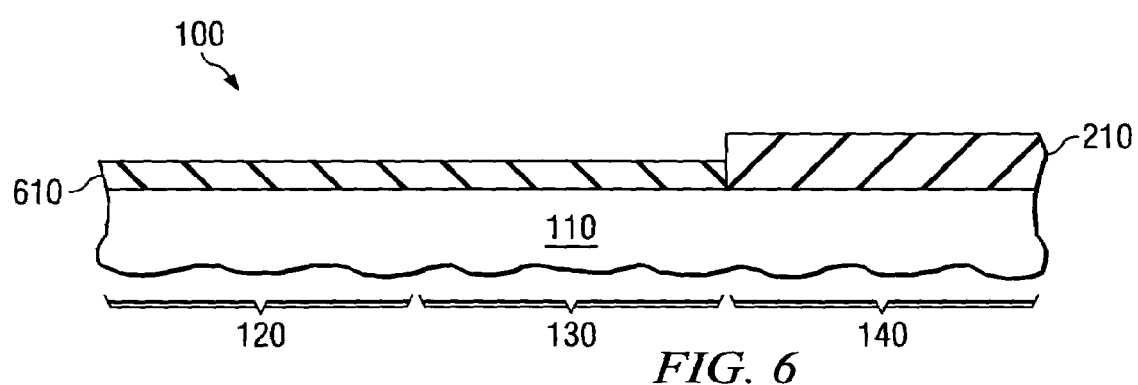

Turning now to FIG. 6, illustrated is a sectional view of the semiconductor device 100 of FIG. 5 after incorporating oxygen into the first layer of gate dielectric material 510 to form a first layer of gate dielectric material 610 having oxygen therein. The first layer of gate dielectric material 610, in this embodiment, is located over the substrate 110 in the left and center active regions 120, 130, and comprises $Si_xN_yO_z$. For example, the $Si_xN_yO_z$ might have a surplus of nitrogen as compared to oxygen, thus y>z>0.

The oxygen may be incorporated using one of any number of different processes. For instance, the first layer of gate dielectric material 610 may be subjected to a radical oxidation process to form the gate dielectric material comprising $Si_xN_yO_z$. The radical oxidation process, among other conditions, might use a temperature ranging from about 200° C. to about 400° C., a pressure ranging from about 30 mTorr to about 150 mTorr, a microwave power ranging from about 500 Watts to about 1500 Watts, in the presence of a flow of oxygen ranging from about 5 sccm to about 50 sccm and a flow of argon ranging from about 850 sccm to about 1250 sccm, for a time period ranging from about 5 seconds to about 20 seconds. Other conditions outside of the aforementioned ranges could also be used. Similarly, the first layer of gate dielectric material 610 having oxygen therein might be formed using a completely different process.

As is illustrated in FIG. 6, the incorporation of oxygen into the first layer of gate dielectric material 510, particularly when doing so using a radical oxidation process, substantially, if not completely, replaces the nitrogen atoms in the layer of nitrogen atoms 520 with oxygen atoms, all the while incorporating the oxygen into the first layer of gate dielectric material 510. This radical oxidation process may, at the same time, replace a small portion of the nitrogen atoms located in the upper surface of the first layer of gate dielectric material 610 with oxygen atoms.

In an optional step of the present invention, the first layer of gate dielectric material 610 may be subjected to a reoxidation step after incorporating the oxygen therein. For example, the first layer of gate dielectric material 610 may be subjected to a reoxidation step using an anneal temperature ranging from about 900° C. to about 1100° C., a pressure ranging from about 10 Torr to about 50 Torr, an $O_2$, $N_2O$, NO or any mixture thereof flow rate ranging from about 10 slm to about 20 slm, for a time period ranging from about 2 seconds to about 20 seconds.

Figure 7:
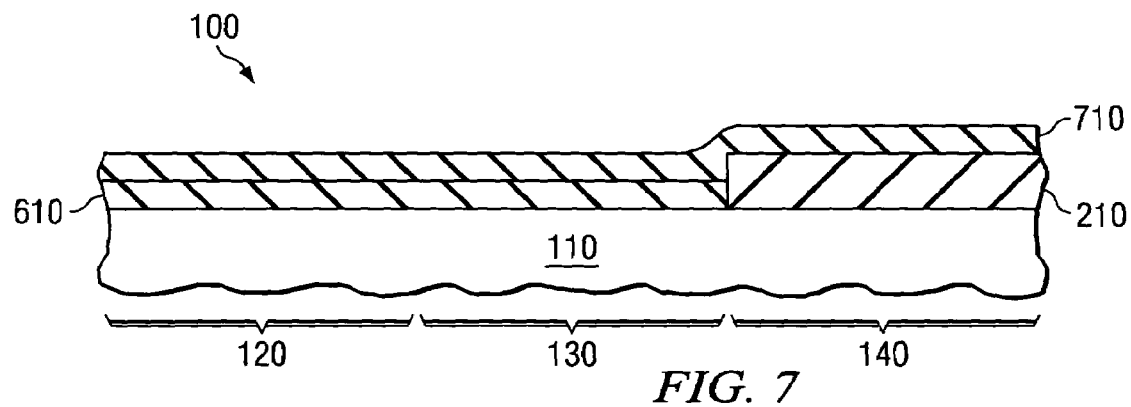

Turning now briefly to FIG. 7, illustrated is a sectional view of the semiconductor device 100 illustrated in FIG. 6 after forming a second masking layer 710 over one or more of the left, center, or right active regions 120, 130, 140. In the embodiment shown, the second masking layer 710 is formed over all of the left, center, and right active regions 120, 130, 140. The second masking layer 710 may comprise many different materials and may be formed using many different processes and remain within the purview of the present invention. In many embodiments, however, the second masking layer 710 will comprise the same material as the masking layer 210 described above. The second masking layer 710 may be formed using the same deposition techniques as used to form the masking layer 210. Accordingly, no further detail is warranted.

Figure 8:
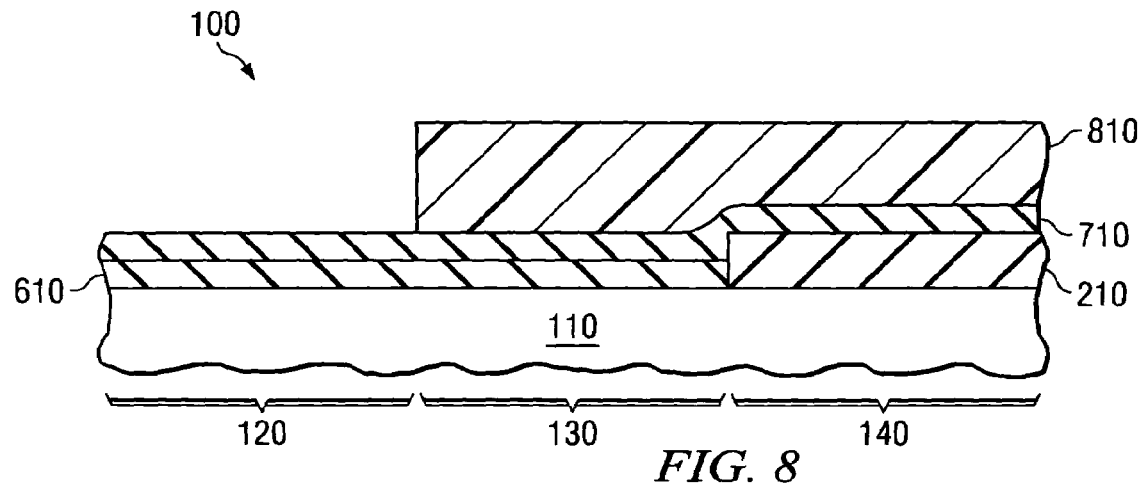

Turning now to FIG. 8, illustrated is a sectional view of the semiconductor device 100 of FIG. 7 after forming a second photoresist portion 810 over the second masking layer 710. In the given embodiment of FIG. 8, the second photoresist portion 810 may be conventionally spun on, exposed and developed, resulting in the second photoresist portion 810 remaining in the center and right active regions 130, 140. Again, in other embodiments of the present invention the photoresist portion 810 might remain in other active regions. Those skilled in the art understand the processing steps that might be taken to form and pattern the second photoresist portion 810.

Figure 9:
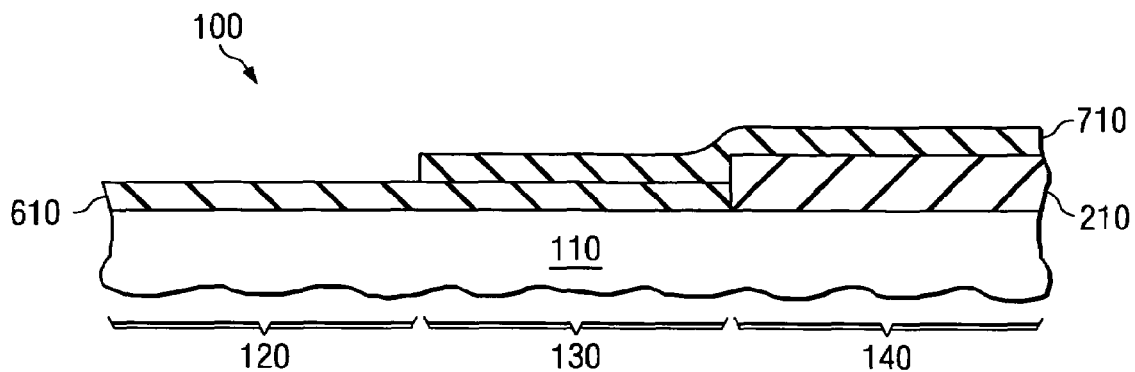

Turning now to FIG. 9, illustrated is a sectional view of the semiconductor device 100 of FIG. 8 after patterning the second masking layer 710 using the second photoresist portion 810 and an etchant. In the embodiment of FIG. 9, the second masking layer 710 is patterned to expose the first layer of gate dielectric material 610 in the left active region 120, and protect the first layer of gate dielectric material 610 in the center active region 130 and the masking layer 210 in the right active region 140. Those skilled in the art understand the various processes for patterning the second masking layer 710.

Figure 10:
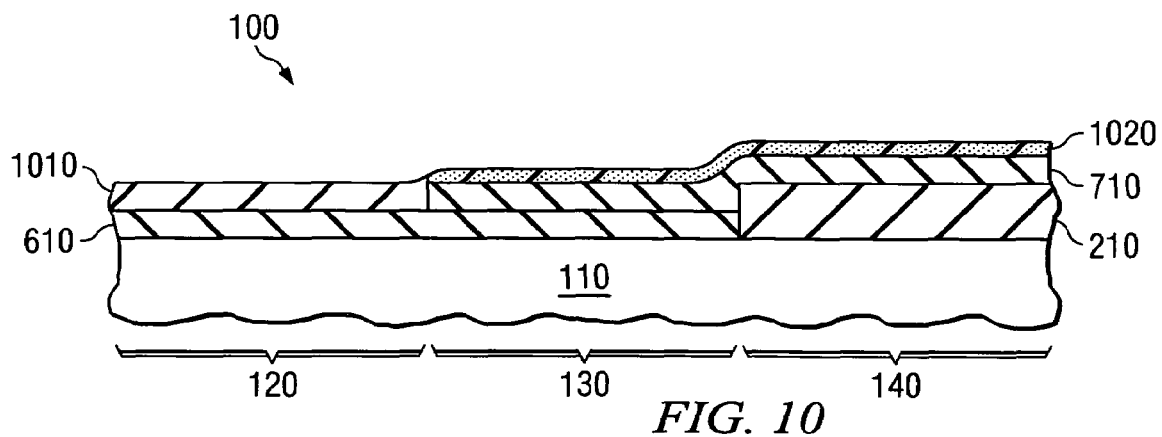

Turning now to FIG. 10, illustrated is a sectional view of the semiconductor device 100 of FIG. 9 after subjecting exposed portions of the first layer of gate dielectric material 610 to a nitrogen containing plasma. As is illustrated in the embodiment of FIG. 10, the nitrogen containing plasma forms a second layer of gate dielectric material 1010 over the first layer of gate dielectric material 610 in the left active region 120. In this embodiment, the nitrogen containing plasma additionally forms a layer of nitrogen atoms 1020 in or on an upper surface of the second masking layer 710 in the center and right active regions 130, 140. The second layer of gate dielectric material 1010, among others, may be formed using the same materials and procedures as used to form the first layer of gate dielectric material 510. Accordingly, the second layer of gate dielectric material 1010 located over the left active region 120, at this stage of manufacture, would typically comprise $Si_xN_y$, and might have a thickness ranging from about 1 nm to about 3 nm, among others. Additionally, the thickness of the layer of nitrogen atoms 1020 formed in or on the second masking layer 710 would typically range from about 0.4 nm to about 0.8 nm.

Figure 11:
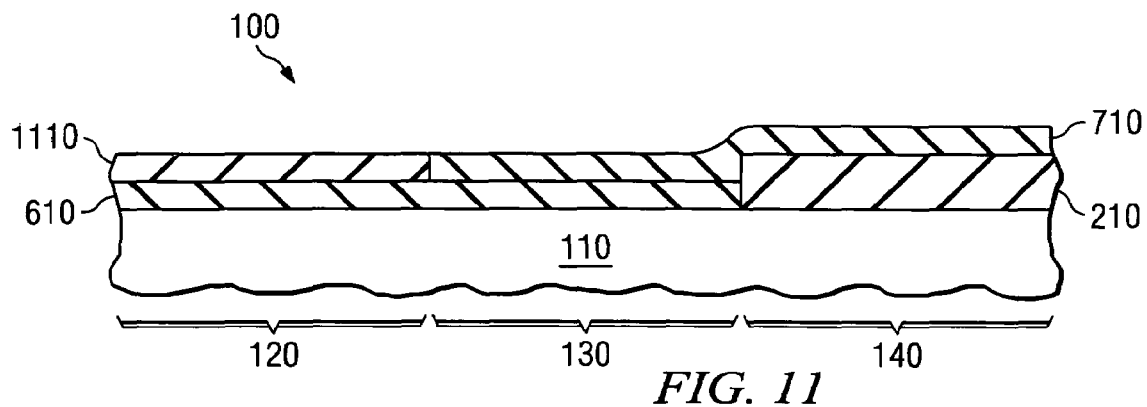

Turning now to FIG. 11, illustrated is a sectional view of the semiconductor device 100 of FIG. 10 after incorporating oxygen into the second layer of gate dielectric material 1010 to form a second layer of gate dielectric material 1110 having oxygen therein. The second layer of gate dielectric material 1110, in this embodiment, is located over the first layer of gate dielectric material 610 in the left active region 120, and comprises $Si_xN_yO_z$. Similar to the first layer of gate dielectric material 610, the second layer of gate dielectric material 1110 comprising $Si_xN_yO_z$ might have a surplus of nitrogen as compared to oxygen, thus $y>z>0$. As is illustrated in FIG. 11, the incorporation of oxygen into the second layer of gate dielectric material 1010 may again substantially replace the nitrogen atoms in the layer of nitrogen atoms 1020 with oxygen atoms.

The oxygen may be incorporated into the second layer of gate dielectric material 1010 using a number of different processes, however, in one embodiment the oxygen is incorporated using a radical oxidation process. For example, the same radical oxidation process used to incorporate the oxygen into the first layer of gate dielectric material 510 could be used. Accordingly, no further detail is needed. An optional reoxidation step may again be used.

Figure 12:
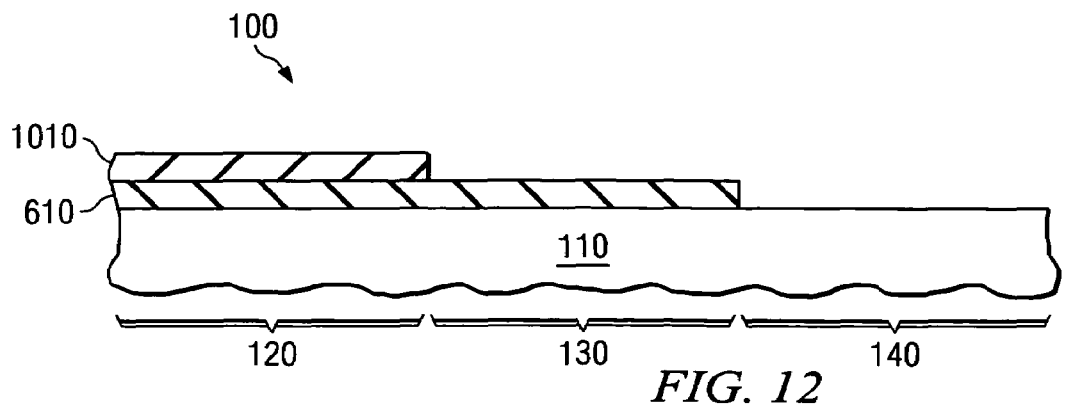

Turning now to FIG. 12, illustrated is a sectional view of the semiconductor device 100 of FIG. 11 after removing the masking layer 210 and second masking layer 710. Those skilled in the art understand the processes that might be used to remove the masking layer 210 and second masking layer 710, including using a selective etch for their removal. In one embodiment, a 5% hydrofluoric acid etch is used to remove the first and second masking layers 210, 710, this etch removing approximately 30 nm/min of the masking layers while only removing about 0.8 nm/min of the gate dielectric material. In an alternative embodiment, a 0.5% hydrofluoric acid etch is used to remove the first and second masking layers 210, 710, this etch removing approximately 7 nm/min of the masking layers while removing very little, if any, of the gate dielectric material.

Figure 13:
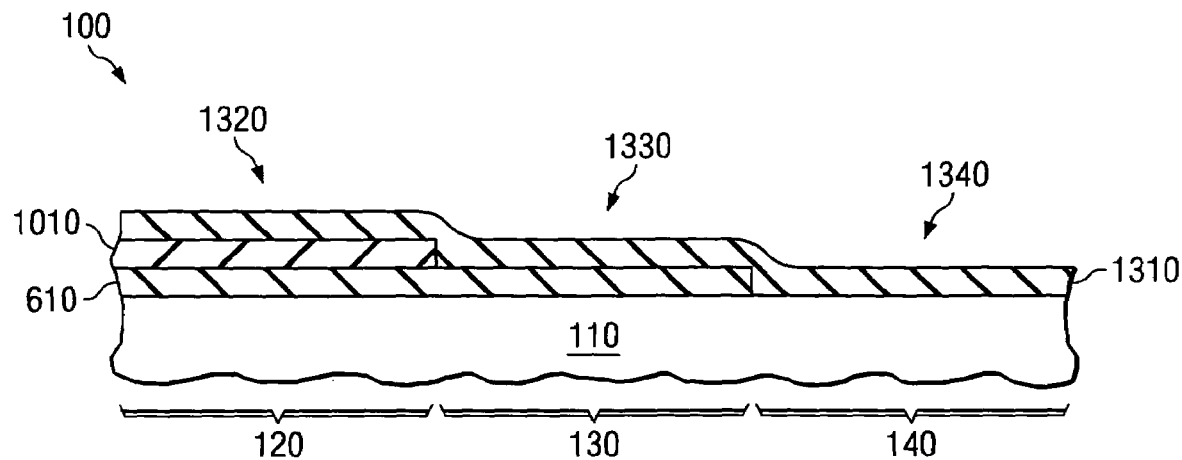

Turning now to FIG. 13, illustrated is a sectional view of the semiconductor device 100 of FIG. 12 after forming a third layer of gate dielectric material 1310 over the semiconductor substrate 110. As is illustrated, the third layer of gate dielectric material 1310 is located over the second layer of gate dielectric material 1010 in the left active region 120, the first layer of gate dielectric material 610 in the center active region 130, and the semiconductor substrate 110 in the right active region 140. For instance, the third layer of gate dielectric material 1310 might be blanket formed over each of the left, center and right active device regions 120, 130, 140.

The third layer of gate dielectric material 1310 may comprise a number of different materials and remain within the scope of the present invention. However, one embodiment of the present invention has the third layer of gate dielectric material 1310 comprise $Si_xN_yO_z$. For example, the third layer of gate dielectric material 1310 might comprise $Si_xN_yO_z$, wherein y>z>0. Thus, in this embodiment the third layer of gate dielectric material 1310 is a nitrogen rich silicon oxynitride layer. In other embodiments, the third layer of gate dielectric material 1310 might comprise another type of nitrided gate dielectric material. The third layer of gate dielectric material 1310, in accordance with the principles of the present invention, would generally have a thickness ranging from about 1 nm to about 3 nm. Other thicknesses could nonetheless also be used and remain within the purview of the present invention.

The third layer of gate dielectric material 1310 may be formed using various different processes. However, in one embodiment the third layer of gate dielectric material 1310 is formed by first subjecting the second layer of gate dielectric material 1010 in the left active region 120, the first layer of gate dielectric material 610 in the center active region 130, and the semiconductor substrate 110 in the right active region 140 to a nitrogen containing plasma, thereby forming a layer comprising $Si_xN_y$. This process might be substantially similar to that discussed above with respect to FIGS. 5 and 10, for instance using a radical nitridation process. After forming the layer comprising $Si_xN_y$, the layer comprising $Si_xN_y$ may have oxygen incorporated therein to form the third layer of gate dielectric material 1310, in this embodiment comprising $Si_xN_yO_z$. This process might be substantially similar to that discussed above with respect to FIGS. 6 and 11, for instance using a radical oxidation process.

In an optional step of the present invention, the third layer of gate dielectric material 1310 may again be subjected to a reoxidation step after incorporating the oxygen therein. What results, at least in this embodiment, is a first greater thickness gate dielectric 1320 in the left active region 120, a second lesser thickness gate dielectric 1330 in the center active region 130, and a third even lesser thickness gate dielectric 1340 in the right active region 140.

Figure 14:
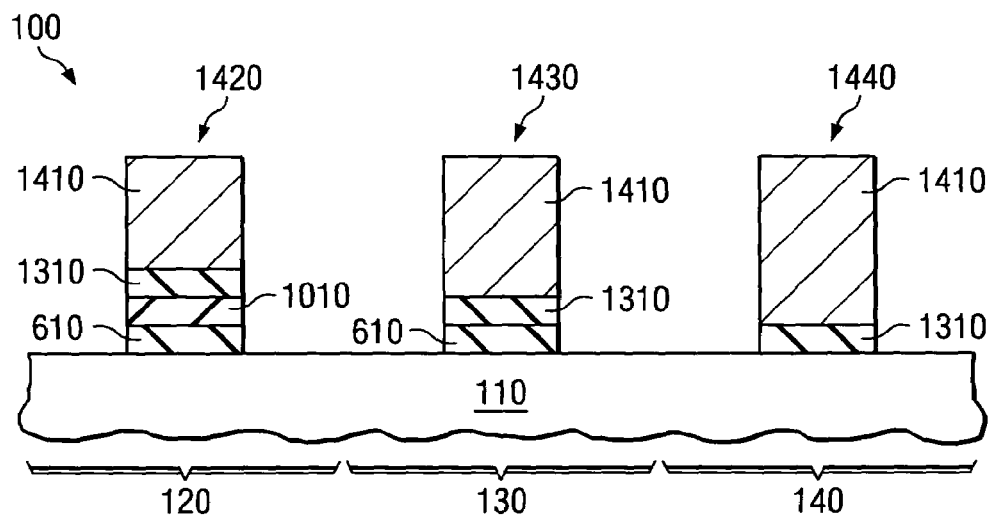

Turning now to FIG. 14, illustrated is a sectional view of the semiconductor device 100 of FIG. 13 after forming a layer of gate electrode material over the left, center and right active regions 120, 130, 140, and then patterning the layer of gate electrode material, third layer of gate dielectric material 1310, second layer of gate dielectric material 1010 and first layer of gate dielectric material 610. What results are a first gate structure 1420, second gate structure 1430 and third gate structure 1440, located in the left, center and right active regions 120, 130, 140, respectively. Those skilled in the art understand the processes that may be used to form the layer of gate electrode material, as well as pattern it and the layers of gate dielectric material located therebelow. Thus, no detail is warranted for this process.

As is illustrated in the embodiment of FIG. 14, the first gate structure 1420 includes a gate electrode 1410, the third layer of gate dielectric material 1310, the second layer of gate dielectric material 1010 and the first layer of gate dielectric material 610. Alternatively, the second gate structure 1430 includes the gate electrode 1410, the third layer of gate dielectric material 1310 and the first layer of gate dielectric material 610, and the third gate structure 1440 includes the gate electrode 1410 and only the third layer of gate dielectric material 1310. In this embodiment, the first gate structure 1420 might be tailored for use in an input/output active region, the second gate structure 1430 might be tailored for use in a first core region designed for a first performance and voltage requirement, and the third gate structure 1440 might be tailored for use in a second core region designed for a second different performance and voltage requirement. This configuration, however, is but one embodiment of the present invention.

Turning now to FIGS. 15-27, illustrated are sectional views illustrating how one might, in an alternative embodiment, manufacture a semiconductor device in accordance with the principles of the present invention. The process for forming a semiconductor device described with respect to FIGS. 15-27 is very similar to the process for forming a semiconductor device described with respect to FIGS. 1-14. Accordingly, similar reference numerals may be used in certain instances. When used, the similar reference numerals indicate that similar materials and processing conditions could (but not must) be used to form the features. In most instances, the positioning or location of the referenced feature may be the only difference between FIGS. 1-14 and the related ones of FIGS. 15-27.

Figure 15:
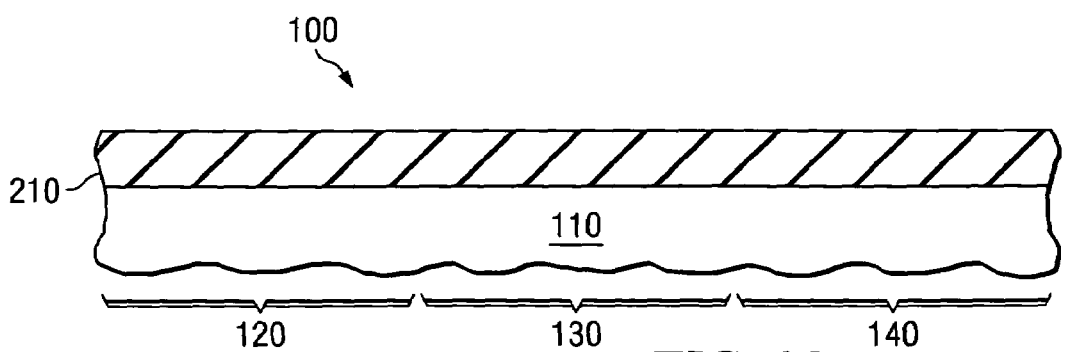
FIGS. 15-27 illustrate sectional views showing how one might, in an alternative embodiment, manufacture a semiconductor device in accordance with the principles of the present invention.
Figure 16:
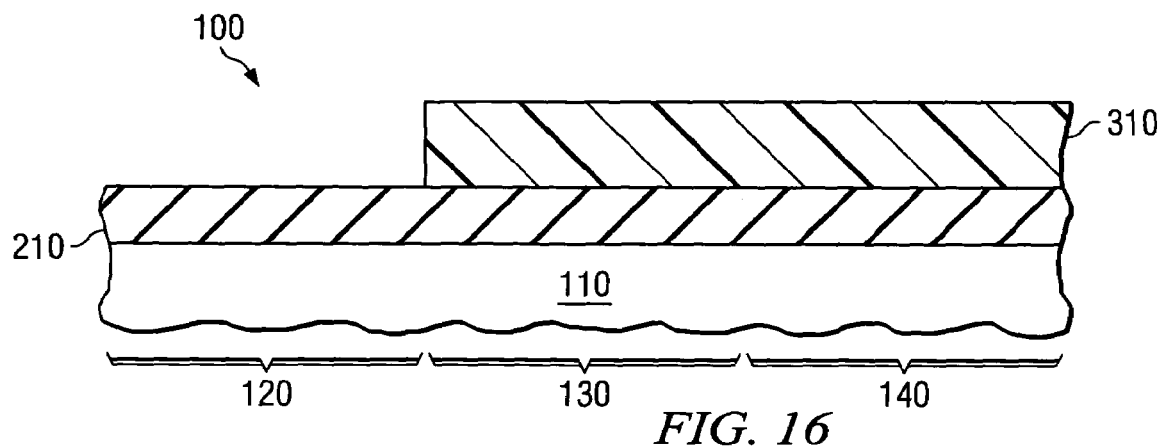
Figure 17:
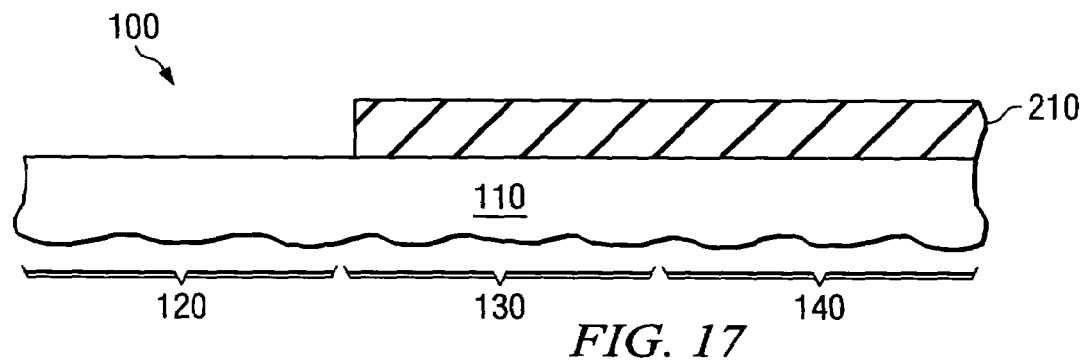

FIG. 15 is substantially similar to FIG. 2, thus the skilled person when reading the description with respect to FIG. 2 would understand its features and any processes that might be required for its manufacture. FIG. 16 is substantially similar to FIG. 3, with the exception that the first photoresist portion 310 in FIG. 16 is located over both the center and right active regions 130, 140, as opposed to only over the right active region 140 in FIG. 3. FIG. 17 is substantially similar to FIG. 4, with the exception that the first masking layer 210 is located over both the center and right active regions 130, 140, as opposed to only over the right active region 140 in FIG. 4.

Figure 18:
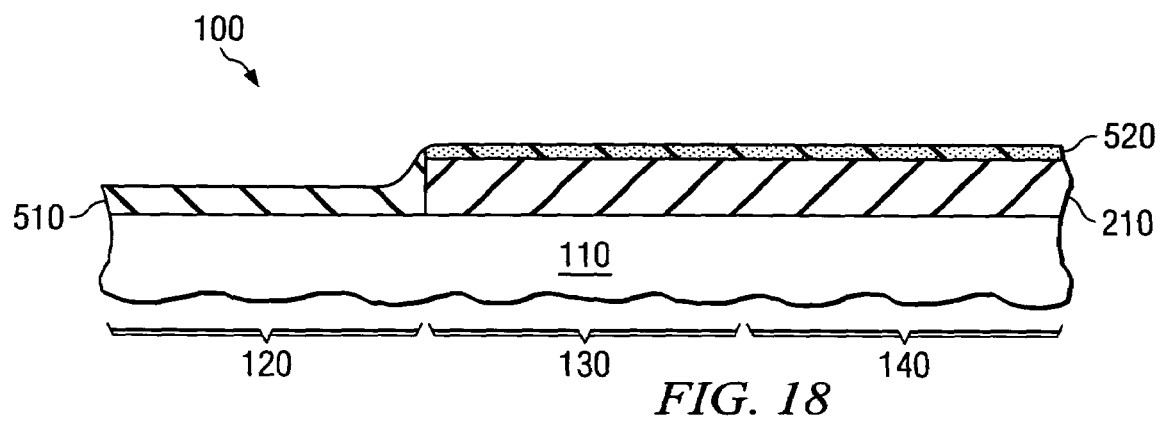

FIG. 18 is substantially similar to FIG. 5, with the exception that the first layer of gate dielectric material 510 is located over the substrate 110 in only the left active region 120, and not over the substrate 110 in the left and center active regions 120, 130 as is illustrated in FIG. 5. FIG. 18 further illustrates that the layer of nitrogen atoms 520 is located in both the center and right active regions 130, 140, as opposed to only in the right active region 140 in FIG. 5.

Figure 19:
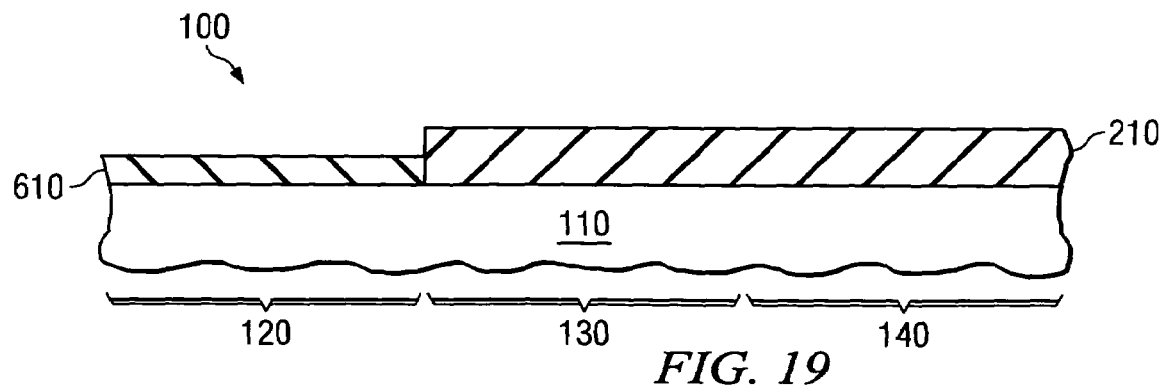
Figure 20:
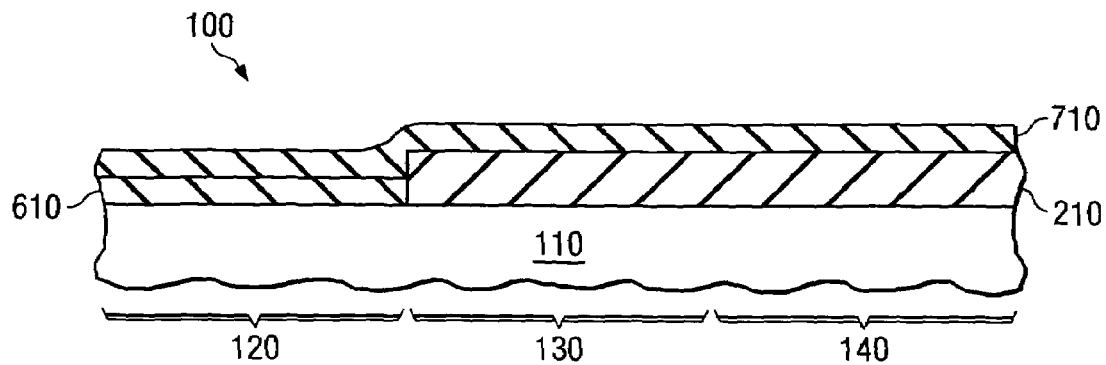
Figure 21:
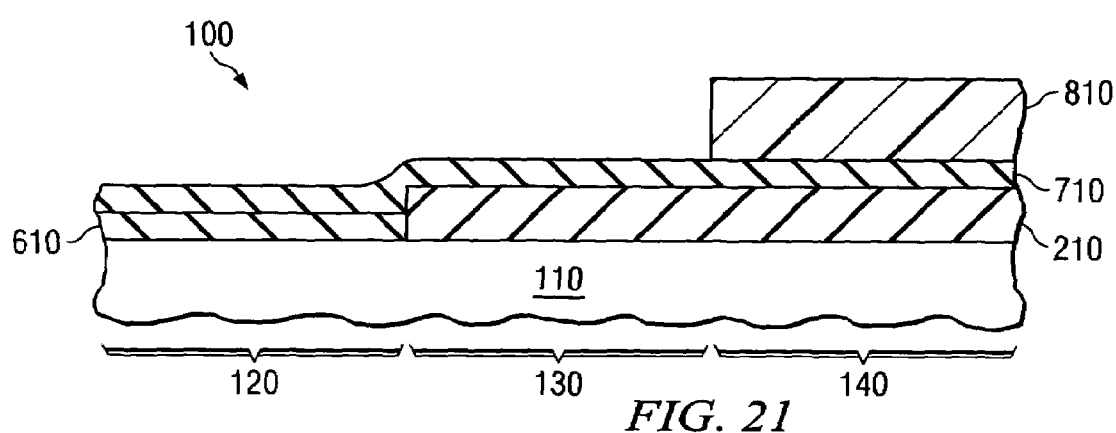

FIG. 19 is substantially similar to FIG. 6, with the exception that the first layer of gate dielectric material 610 including oxygen is located over the left active region 120, as opposed to over both the left and center active regions 120, 130 in FIG. 6. FIG. 20 is substantially similar to FIG. 7, with the exception to the differences shown in previous FIGS. 15-19. FIG. 21 is substantially similar to FIG. 8, with the exception that the second photoresist portion 810 in FIG. 21 is located over only the right active region 140, as opposed to over both the center and right active regions 130, 140 in FIG. 8.

Figure 22:
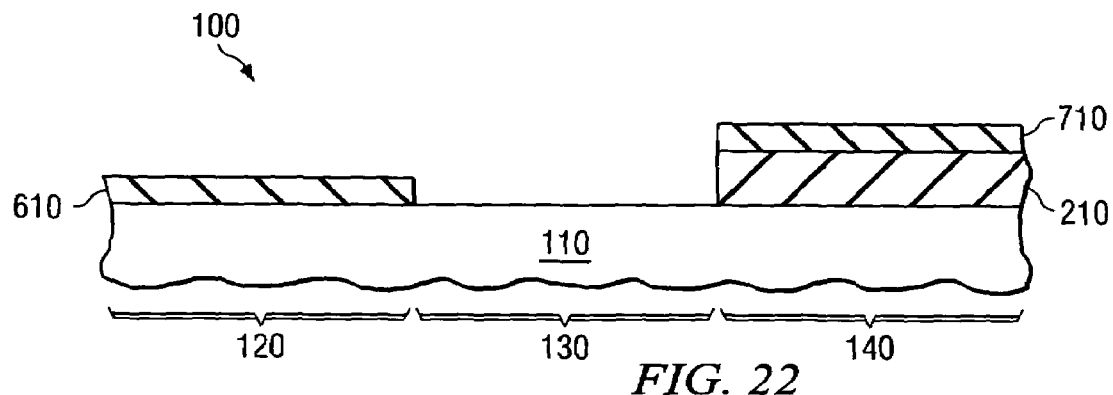
Figure 23:
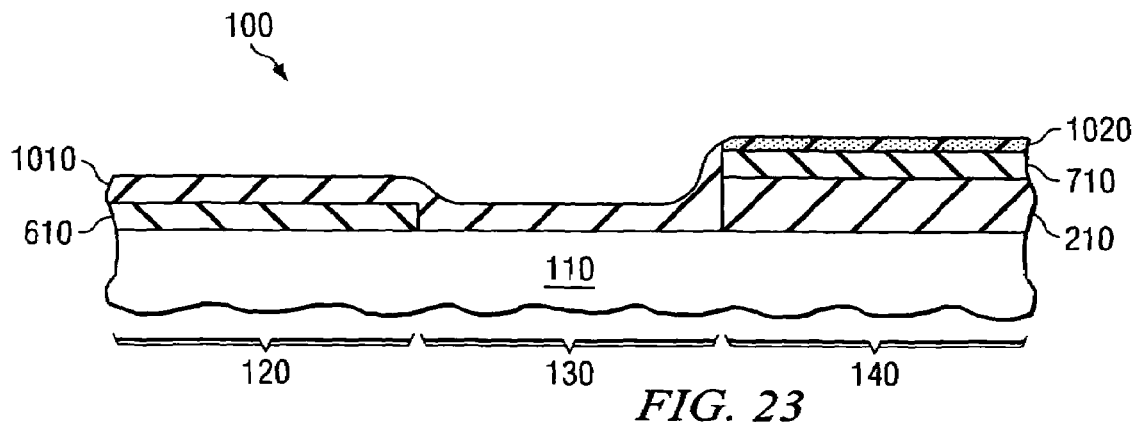

FIG. 22 is substantially similar to FIG. 9, with the exception that the second masking layer 710 is only located over the right active region 140, as opposed to over both the center and right active regions 130, 140 in FIG. 9. FIG. 23 is substantially similar to FIG. 10, with the exception that the second layer of gate dielectric material 1010 is located over the first layer of gate dielectric material 610 in the left active region 120 and over the substrate 110 in the center region 130, and not only over the first layer of gate dielectric material 610 in the left active region 120, as is illustrated in FIG. 11. FIG. 23 further illustrates that the second layer of nitrogen atoms 1020 is located only in the right active region 140, and not over both the center and right active regions 130, 140, as is illustrated in FIG. 10.

Figure 24:
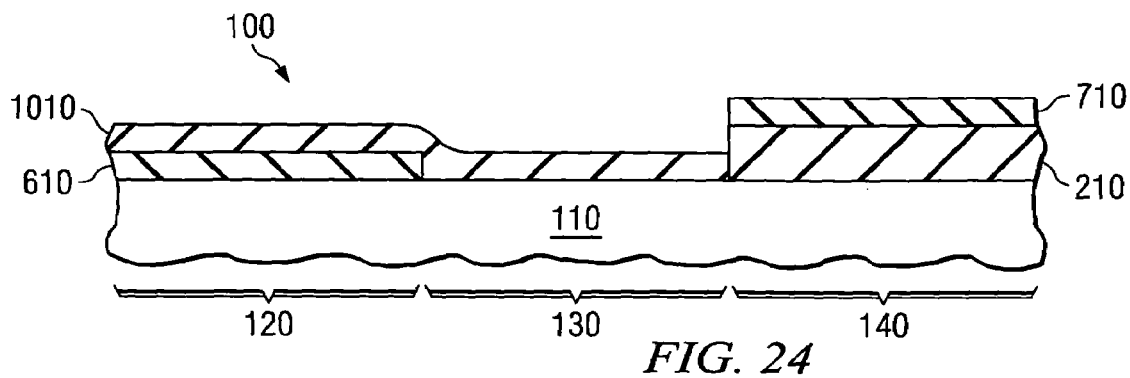
Figure 25:
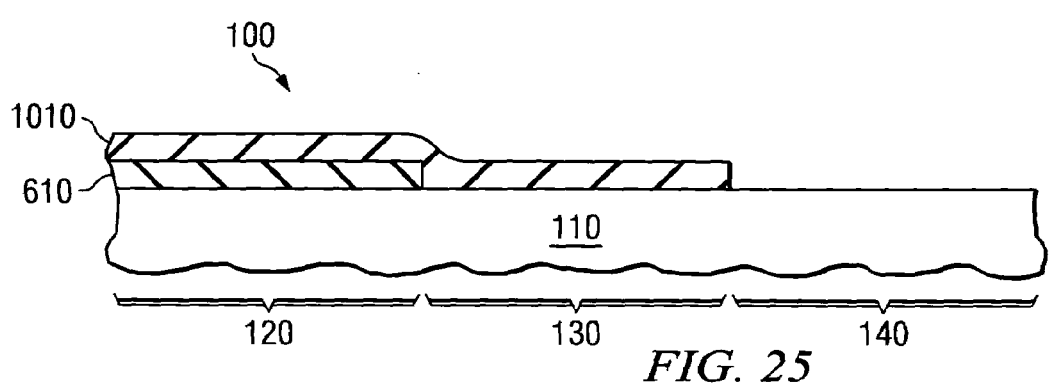
Figure 26:
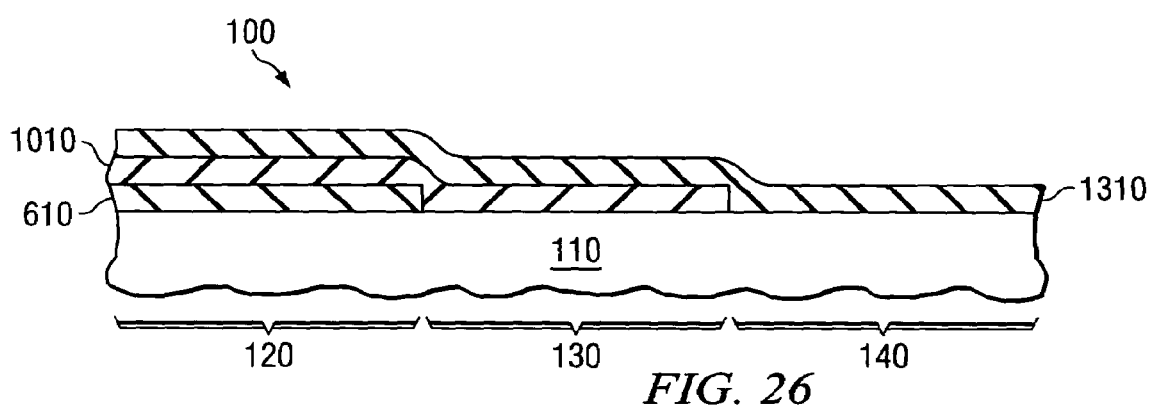
Figure 27:
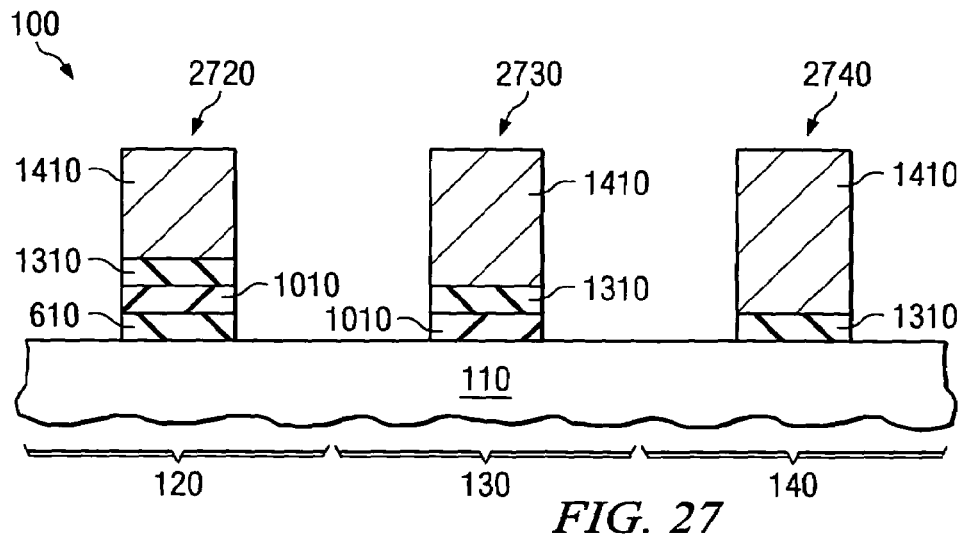

FIG. 24 is substantially similar to FIG. 11, with the exception of the differences shown in previous FIGS. 15-23. FIGS. 25-26 are substantially similar to FIGS. 12-13, with the exception of the differences shown in previous FIGS. 15-24. FIG. 27 is substantially similar to FIG. 14, however, in FIG. 27 the first gate structure 1420 includes a gate electrode 1410, the third layer of gate dielectric material 1310, the second layer of gate dielectric material 1010 and the first layer of gate dielectric material 610, the second gate structure 1430 includes the gate electrode 1410, the third layer of gate dielectric material 1310 and the second layer of gate dielectric material 1010, and the third gate structure 1440 includes the gate electrode 1410 and the third layer of gate dielectric material 1310.

Again, the embodiments of FIGS. 1-14 and 15-27 illustrate how one skilled in the art might manufacture triple gate dielectric thickness layers. For example, in the embodiments of FIGS. 1-14 and 15-27, the left active region 120 might be the first active region, the right active region might be the second active region and the center active region might be the third active region. If the process of manufacturing the triple gate dielectric thickness layers of FIGS. 1-14 and 15-27 were applied to the formation of dual gate dielectric thickness layers, the left active region 120 might be the first active region, the right active region 140 might be the second active region, and the center active region 130 would not typically exist.

The manufacturing processes taught by FIGS. 1-14 and 15-27 provide many benefits over the standard processes. For instance, these processes incorporate more nitrogen atoms into the dielectrics that comprise each of the gate structures than traditionally existed. Accordingly, each of the gate structures, whether high or low voltage, have lower leakage currents. Additionally, the process flow is compatible with existing processes, and there is no need for additional patterning steps. Likewise, the process is deglaze friendly.

Figure 28:
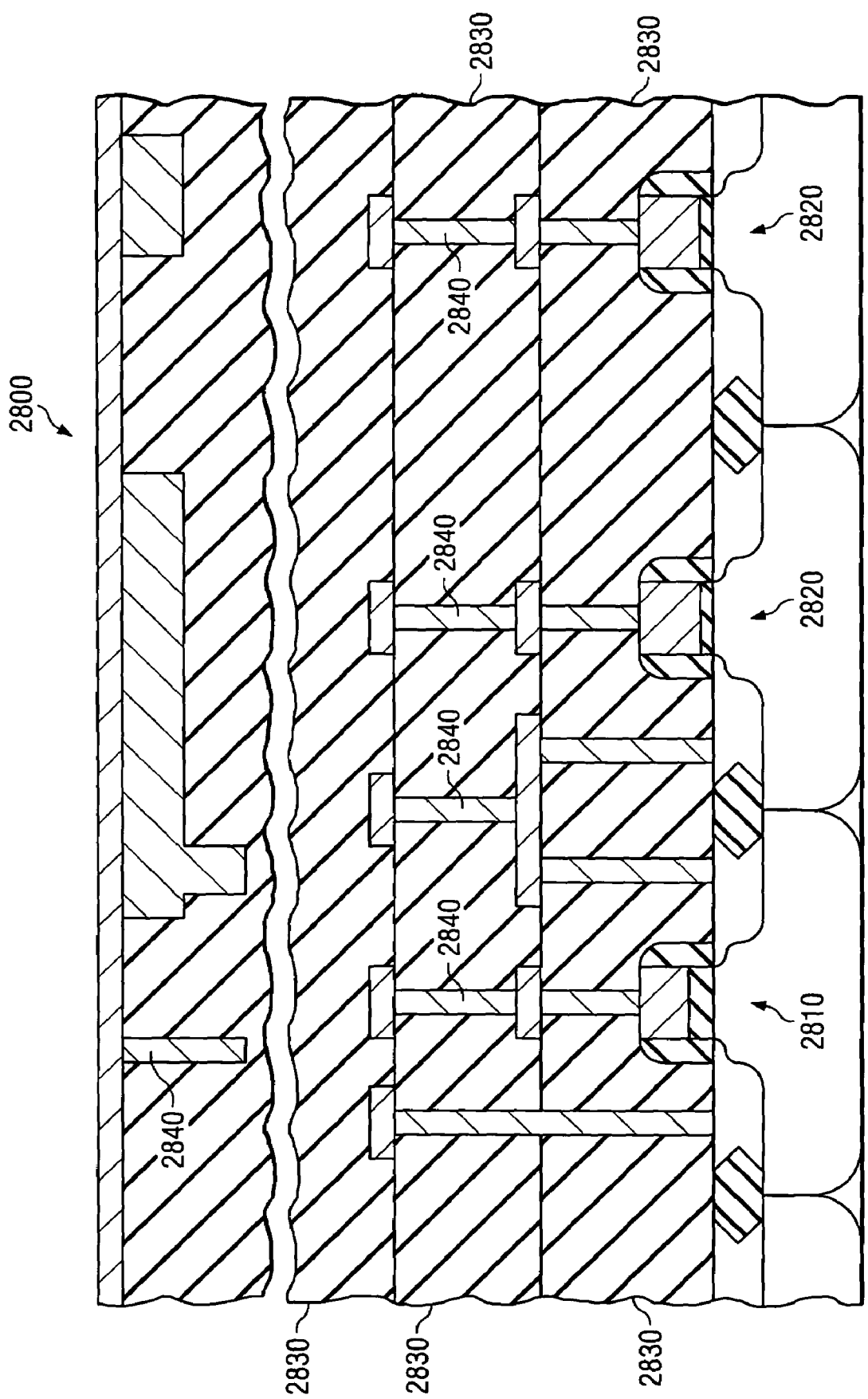
FIG. 28 illustrates a sectional view of an integrated circuit (IC) incorporating semiconductor devices constructed according to the principles of the present invention.

Turning lastly to FIG. 28, illustrated is a sectional view of an integrated circuit (IC) 2800 incorporating semiconductor devices 2810, 2820 constructed according to the principles of the present invention. The IC 2800 may include devices, such as transistors used to form CMOS devices, BiCMOS devices, Bipolar devices, as well as capacitors or other types of devices. The IC 2800 may further include passive devices, such as inductors or resistors, or it may also include optical devices or optoelectronic devices. Those skilled in the art are familiar with these various types of devices and their manufacture. In the particular embodiment illustrated in FIG. 28, the IC 2800 includes an input/output semiconductor device 2810, and one or more core semiconductor devices 2820 manufactured in accordance with the principles discussed above. The semiconductor devices 2810, 2820 have dielectric layers 2830 located thereover. Additionally, interconnect structures 2840 are located within the dielectric layers 2830 to interconnect various devices, thus, forming the operational integrated circuit 2800.

Although the present invention has been described in detail, those skilled in the art should understand that they could make various changes and substitutions herein without departing from the spirit and scope of the invention in its broadest form.

What is claimed is:

1. A method for manufacturing a semiconductor device having multiple gate dielectric thickness layers, the method comprising:

forming a masking layer over a semiconductor substrate in a first active region and a second active region of a semiconductor device;

patterning the masking layer to expose the semiconductor substrate in the first active region;

subjecting exposed portions of the semiconductor substrate to a nitrogen containing plasma, thereby forming a first layer of gate dielectric material over the semiconductor substrate in the first active region;

incorporating oxygen into the first layer of gate dielectric material located in the first active region, and then removing the patterned masking layer; and forming a second layer of gate dielectric material over the first layer of gate dielectric material in the first active region and over the semiconductor substrate in the second active region, thereby resulting in a first greater thickness gate dielectric in the first active region and a second lesser thickness gate dielectric in the second active region, wherein the first greater thickness gate dielectric in the first active region includes the first layer of gate dielectric material and the second layer of gate dielectric material and the second lesser thickness gate dielectric in the second active region includes only the second layer of gate dielectric material.

2. The method as recited in claim 1, wherein forming a second layer of gate dielectric material includes forming a second layer of gate dielectric material comprising $Si_xN_yO_z$, and further wherein y>z>0.

3. The method as recited in claim 1, wherein patterning the masking layer includes patterning a silicon dioxide masking layer.

4. The method as recited in claim 3, wherein subjecting exposed portions further includes subjecting the patterned silicon dioxide masking layer to the nitrogen containing plasma, thereby forming a layer of nitrogen atoms on or in an upper surface of the patterned silicon dioxide masking layer.

5. The method as recited in claim 4, wherein the incorporating oxygen into the first layer of gate dielectric material substantially replaces the layer of nitrogen atoms from the upper surface of the patterned silicon dioxide masking layer with oxygen atoms.

6. The method as recited in claim 3, wherein removing the patterned masking layer includes removing the silicon dioxide masking layer using hydrofluoric acid.

7. The method as recited in claim 1, wherein the first layer of gate dielectric material, after the incorporating oxygen, comprises $Si_xN_yO_z$, and further wherein y>z>0.

8. The method as recited in claim 1, wherein incorporating oxygen into the first layer of gate dielectric material includes subjecting the first layer of gate dielectric material to a radical oxidation process.

9. The method as recited in claim 1, further including subjecting the first layer of gate dielectric material to an anneal temperature ranging from about 900° C. to about 1100° C. after incorporating the oxygen.

10. The method as recited in claim 1, further including forming a layer of gate electrode material over the first and second active regions after forming the second layer of gate dielectric material; and patterning the layer of gate electrode material, the first layer of gate dielectric material and the second layer of gate dielectric material to result in a first gate structure in the first active region including the gate electrode material, the first layer of gate dielectric material and the second layer of gate dielectric material, and a second gate structure in the second active region including the gate electrode material and the second layer of gate dielectric material.

11. A method for manufacturing a semiconductor device having multiple gate dielectric thickness layers, the method comprising:

forming a first masking layer over a semiconductor substrate in a first active region, a second active region, and a third active region of a semiconductor device;

patterning the first masking layer to expose the semiconductor substrate in the first active region and protect the semiconductor substrate in the second active region and the third active region;

subjecting exposed portions of the semiconductor substrate to a nitrogen containing plasma, thereby forming a first layer of gate dielectric material over the semiconductor substrate in the first active region;

incorporating oxygen into the first layer of gate dielectric material located in the first active region;

patterning a second masking layer to expose the first layer of gate dielectric material in the first active region and the semiconductor substrate in the second active region and protect the semiconductor substrate in the third active region;

removing the first patterned masking layer from over the second active region; subjecting portions exposed by the second masking layer to a second nitrogen containing plasma, thereby forming a second layer of gate dielectric material over the first layer of gate dielectric material in the first active region and over the semiconductor substrate in the second active region, thereby resulting in a first greater thickness gate dielectric in the first active region and a second lesser thickness gate dielectric in the second active region.

12. The method as recited in claim 11, further including incorporating oxygen into the second layer of gate dielectric material located in the first active region and the second active region; and then removing at least one of the first masking layer or second masking layer.

13. The method as recited in claim 12, further including forming a third layer of gate dielectric material over the first, second and third active regions after removing the at least one of the first or second masking layers; then forming a layer of gate electrode material over the first, second and third active regions; and patterning the layer of gate electrode material, first layer of gate dielectric material, second layer of gate dielectric material and third layer of gate dielectric material; thereby resulting in a first gate structure in the first active region, a second gate structure in the second active region, and a third gate structure in the third active region; the first gate structure including the gate electrode material, first layer of gate dielectric material, second layer of gate dielectric material, and third layer of gate dielectric material; the second gate structure including the gate electrode material, the second layer of gate dielectric material, and the third layer of gate dielectric material and the third gate structure including the gate electrode material and the third layer of gate dielectric material.

14. A method for manufacturing a semiconductor device having multiple gate dielectric thickness layers, the method comprising:

forming a first masking layer over a semiconductor substrate in a first active region, a second active region, and a third active region of a semiconductor device;

patterning the first masking layer to expose the semiconductor substrate located in the first active region and the second active region and protect the semiconductor substrate located in the third active region;

subjecting exposed portions of the semiconductor substrate to a nitrogen containing plasma, thereby forming a first layer of gate dielectric material over the semiconductor substrate in the first active region and the second active region;

incorporating oxygen into the first layer of gate dielectric material located in the first active region and the second active region;

patterning a second masking layer to expose the first layer of gate dielectric material in the first active region and protect the first layer of gate dielectric material in the second active region and the semiconductor substrate in the third active region;

subjecting portions exposed by the second masking layer to a second nitrogen containing plasma, thereby forming a second layer of gate dielectric material over the first layer of gate dielectric material in the first active region;

removing the first patterned masking layer; and forming a third layer of gate dielectric material over the first layer of gate dielectric material and the second layer of gate dielectric material in the first active region and over the first layer of gate dielectric material in the second active region, thereby resulting in a first greater thickness gate dielectric in the first active region and a second lesser thickness gate dielectric in the second active region.

15. The method as recited in claim 14, further including incorporating oxygen into the second layer of gate dielectric material located in the first active region, and then removing at least one of the first masking layer or second masking layer.

16. The method as recited in claim 14, further including forming the third layer of gate dielectric material over the third active region after removing the at least one of the first or second masking layers then forming a layer of gate electrode material over the first, second and third active regions and patterning the layer of gate electrode material, first layer of gate dielectric material, second layer of gate dielectric material and third layer of gate dielectric material to result in a first gate structure in the first active region, a second gate structure in the second active region, and a third gate structure in the third active region; the first gate structure including the gate electrode material, first layer of gate dielectric material, second layer of gate dielectric material, and third layer of gate dielectric material; the second gate structure including the gate electrode material, the first layer of gate dielectric material and the third layer of gate dielectric material; and the third gate structure including the gate electrode material and the third layer of gate dielectric material.

17. A method for manufacturing a semiconductor device having multiple gate dielectric thickness layers, the method comprising:

forming a masking layer over a semiconductor substrate in a first active region and a second active region of a semiconductor device;

patterning the masking layer to expose the semiconductor substrate in the first active region;

subjecting exposed portions of the semiconductor substrate to a nitrogen containing plasma, thereby forming a first layer of gate dielectric material over the semiconductor substrate in the first active region;

incorporating oxygen into the first layer of gate dielectric material located in the first active region, and then removing the patterned masking layer;

subjecting the first layer of gate dielectric material in the first active region and the semiconductor substrate in the second active region to a nitrogen containing plasma thereby forming a layer comprising $Si_xN_y$;

incorporating oxygen into the layer comprising $Si_xN_y$ to form a second layer of gate dielectric material over the first layer of gate dielectric material in the first active region and over the semiconductor substrate in the second active region, thereby resulting in a first, greater thickness gate dielectric in the first active region and a second, lesser thickness gate dielectric in the second active region, wherein the second layer of gate dielectric material comprises $Si_xN_yO_z$, wherein y>z>0; and after forming the first, greater thickness gate dielectric and the second, lesser thickness gate dielectric, performing a mask removal to completely remove the mask from a surface of the semiconductor substrate.

18. A method for manufacturing a semiconductor device having multiple gate dielectric thicknesses, comprising:

forming a first masking layer over first, second and third active regions of a semiconductor substrate;

patterning the first masking layer to selectively remove the first masking layer to expose the substrate at the first and second active regions, and to leave the first masking layer over the third active region;

applying nitrogen to form a first layer of gate dielectric material at the exposed substrate in the first and second active regions, with nitrogen prevented from passing through the first masking layer left over the third active region;

applying oxygen to incorporate oxygen into the first layer of gate dielectric material formed at the first and second active regions, with the first masking layer left over the third active region;

after incorporating the oxygen, forming a second masking layer over the first layer of dielectric material at the first and second active regions, and over the first masking layer left over the third active region;

patterning the second masking layer to selectively remove the second masking layer to expose the first layer of dielectric material at the first active region, and to leave the second masking layer over the first layer of dielectric material at the second active region and over the first masking layer left over the third active region;

applying nitrogen to form a second layer of gate dielectric material at the exposed first layer of dielectric material at the first active region, with nitrogen prevented from passing through the second masking layer left over the first layer of dielectric material at the second active region and over the first masking layer over the third active region;

applying oxygen to incorporate oxygen into the second layer of gate dielectric material formed at the first layer of dielectric material at the first active region, with the second masking layer left over the first layer of dielectric material at the second active region and over the first masking layer left over the third active region;

removing remaining portions of the second and first masking layers, to leave the second layer of gate dielectric material and first layer of gate dielectric material at the first active region, the first layer of gate dielectric material at the second active region, and to expose the substrate at the third active region; and after removing the remaining portions of the second and first masking layers, forming a third layer of gate dielectric material at the second and first layers of dielectric material formed at the first active region, at the first layer of gate dielectric material formed at the second region, and over the semiconductor substrate at the third region;

whereby first, second and third gate dielectrics having different thicknesses are respectively formed in the first, second and third regions; a thickness of the first gate dielectric being defined by thicknesses of the first, second and third layers of gate dielectric material; a thickness of the second gate dielectric being defined by thicknesses of the first and third layers of gate dielectric material; and a thickness of the third gate dielectric being defined by the thickness of the third gate dielectric material.

19. The method of claim 18, wherein at least one of applying nitrogen to form the first layer of gate dielectric material, applying nitrogen to form the second layer of gate dielectric material, or forming the third layer of gate dielectric material includes performing a radical nitridation process.

20. The method of claim 18, wherein at least one of applying oxygen to incorporate oxygen into the first layer of gate dielectric material, applying oxygen to incorporate oxygen into the second layer of gate dielectric material, or forming the third layer of gate dielectric material includes performing a radical oxidation process.

21. The method of claim 18, wherein at least one of the first, second or third layer of gate dielectric material comprises $Si_xN_yO_z$.

22. The method of claim 18, wherein at least one of the first or second masking layers comprises silicon dioxide.

23. The method of claim 18, wherein forming the third layer of dielectric material comprises performing a blanket deposition.

24. The method of claim 18, wherein forming the third layer of dielectric material comprises applying nitrogen and oxygen.

25. The method of claim 18, wherein applying nitrogen to form the first layer of gate dielectric material and applying nitrogen to form the second layer of gate dielectric material each comprise performing a radical nitridation process using a nitrogen containing plasma to form a material comprising $Si_xN_y$; and applying oxygen to incorporate oxygen into the first layer of gate material and applying oxygen to incorporate oxygen into the second layer of gate material each comprise subjecting the $Si_xN_y$ material to a radical oxidation to form a material comprising $Si_xN_yO_z$.

26. The method of claim 25, wherein the semiconductor substrate comprises silicon; and the first and second masking layers comprise silicon dioxide.

27. The method of claim 25, wherein forming the third layer of dielectric material comprises performing a blanket deposition applying nitrogen and oxygen.

28. A method for manufacturing a semiconductor device having multiple gate dielectric thicknesses, comprising:

forming a first masking layer over first, second and third active regions of a semiconductor substrate;

patterning the first masking layer to selectively remove the first masking layer to expose the substrate at the first active region, and to leave the first masking layer over the second and third active regions;

applying nitrogen to form a first layer of gate dielectric material at the exposed substrate in the first active region, with nitrogen prevented from passing through the first masking layer left over the second and third active regions;

applying oxygen to incorporate oxygen into the first layer of gate dielectric material formed at the first active region, with the first masking layer left over the second and third active regions;

after incorporating the oxygen, forming a second masking layer over the first layer of dielectric material at the first active region, and over the first masking layer left over the second and third active regions;

patterning the second masking layer to selectively remove the second masking layer to expose the first layer of dielectric material at the first active region, to expose the substrate at the second active region, and to leave the second masking layer over the first masking layer left over the third active region;

applying nitrogen to form a second layer of gate dielectric material at the exposed first layer of dielectric material at the first active region and at the exposed substrate at the second active region, with nitrogen prevented from passing through the second masking layer left over the first masking layer over the third active region;

applying oxygen to incorporate oxygen into the second layer of gate dielectric material formed at the first layer of dielectric material at the first active region and at the exposed substrate at the second active region, with the second masking layer left over the first masking layer left over the third active region;

removing remaining portions of the second and first masking layers, to leave the second layer of gate dielectric material and first layer of gate dielectric material at the first active region, the second layer of gate dielectric material at the second active region, and to expose the substrate at the third active region; and after removing the remaining portions of the second and first masking layers, forming a third layer of gate dielectric material at the second and first layers of dielectric material formed at the first active region, at the second layer of gate dielectric material formed at the second region, and over the semiconductor substrate at the third region;

whereby first, second and third gate dielectrics having different thicknesses are respectively formed in the first, second and third regions; a thickness of the first gate dielectric being defined by thicknesses of the first, second and third layers of gate dielectric material; a thickness of the second gate dielectric being defined by thicknesses of the second and third layers of gate dielectric material; and a thickness of the third gate dielectric being defined by the thickness of the third gate dielectric material.

29. The method of claim 28, wherein applying nitrogen to form the first layer of gate dielectric material and applying nitrogen to form the second layer of gate dielectric material each comprise performing a radical nitridation process using a nitrogen containing plasma to form a material comprising $Si_xN_y$; and applying oxygen to incorporate into the first layer of gate material and applying oxygen to incorporate oxygen into the second layer of gate material each comprise subjecting the $Si_xN_y$ material to a radical oxidation to form a material comprising $Si_xN_yO_z$.

30. The method of claim 29, wherein the semiconductor substrate comprises silicon; and the first and second masking layers comprise silicon dioxide.

31. The method of claim 29, wherein forming the third layer of dielectric material comprises performing a blanket deposition applying nitrogen and oxygen.

32. A method for manufacturing a semiconductor device having multiple gate dielectric thickness layers, the method comprising:

forming a masking layer over a semiconductor substrate in a first active region and a second active region of a semiconductor device;

patterning the masking layer to expose the semiconductor substrate in the first active region;

subjecting exposed portions of the semiconductor substrate to a nitrogen containing plasma, thereby forming a first layer of gate dielectric material over the semiconductor substrate in the first active region;

incorporating oxygen into the first layer of gate dielectric material located in the first active region, and then removing the patterned masking layer; and forming a second layer of gate dielectric material over the first layer of gate dielectric material in the first active region and over the semiconductor substrate in the second active region, thereby resulting in a first greater thickness gate dielectric in the first active region and a second lesser thickness gate dielectric in the second active region, wherein the first greater thickness gate dielectric in the first active region includes the first layer of gate dielectric material and the second layer of gate dielectric material and the second lesser thickness gate dielectric in the second active region includes only the second layer of gate dielectric material;

wherein forming a second layer of gate dielectric material includes forming a second layer of gate dielectric material comprising $Si_xN_yO_z$, wherein y>z>0, and subjecting the first layer of gate dielectric material in the first active region and the semiconductor substrate in the second active region to a nitrogen containing plasma, thereby forming a layer comprising $Si_xN_y$, and then incorporating oxygen into the layer comprising $Si_xN_y$ to form the second layer of gate dielectric material comprising $Si_xN_yO_z$.

* * * * *